United States Patent [19]

Rouy

[11] Patent Number: 5,729,162
[45] Date of Patent: Mar. 17, 1998

[54] INTEGRATED CIRCUIT MEMORY WITH COLUMN VOLTAGE HOLDING CIRCUIT

[75] Inventor: Olivier Rouy, Brossolette, France

[73] Assignee: SGS-Thomson Microelectronics S.A., Saint Genis, France

[21] Appl. No.: 811,358

[22] Filed: Mar. 4, 1997

Related U.S. Application Data

[62] Division of Ser. No. 402,519, Mar. 10, 1995, Pat. No. 5,610,860.

[30] Foreign Application Priority Data

Mar. 31, 1994 [FR] France .................... 94 03844

[51] Int. Cl.$^6$ .................................... G11C 16/06
[52] U.S. Cl. ................... 327/103; 327/72; 327/538; 365/185.23; 365/189.07
[58] Field of Search .................... 327/103, 60, 72, 327/73, 538, 541, 543; 365/185.18, 185.23, 189.07, 189.09

[56] References Cited

U.S. PATENT DOCUMENTS

| | | | |
|---|---|---|---|
| 5,146,152 | 9/1992 | Jin et al. ..................... | 323/280 |
| 5,229,963 | 7/1993 | Ohtsuka et al. ................ | 365/185 |
| 5,231,315 | 7/1993 | Thelen, Jr. ..................... | 327/103 |
| 5,359,552 | 10/1994 | Dhong et al. .................. | 365/189.09 |
| 5,363,336 | 11/1994 | Yabe ............................. | 365/226 |
| 5,576,990 | 11/1996 | Camerlenghi et al. ......... | 365/185.23 |

FOREIGN PATENT DOCUMENTS

| | | |
|---|---|---|
| A-0 525 679 | 2/1993 | European Pat. Off. . |
| A-0 574 976 | 12/1993 | European Pat. Off. . |
| A-2 214 380 | 8/1989 | United Kingdom . |

OTHER PUBLICATIONS

French Search Report from French Patent Application 94 03844, filed Mar. 31, 1994.

*Primary Examiner*—Timothy P. Callahan
*Assistant Examiner*—T. T. Lam
*Attorney, Agent, or Firm*—James H. Morris; Wolf, Greenfield & Sacks, P.C.

[57] ABSTRACT

An integrated circuit memory comprises a circuit that keeps the column voltage constant during the recording of a binary value. This circuit has a differential amplifier which measures the difference between a reference voltage given by a voltage divider and a voltage representative of the bit line. This amplifier gives a signal that is applied to the gate of a transistor of the column-addressing circuit.

10 Claims, 2 Drawing Sheets

INTEGRATED CIRCUIT MEMORY WITH COLUMN VOLTAGE HOLDING CIRCUIT

This application is a division of application Ser. No. 08/402,519, filed Mar. 10, 1995 now U.S. Pat. No. 5,610,860, entitled INTERGRATED CIRCUIT MEMORY WITH COLUMN VOLTAGE HOLDING CIRCUIT, now allowed.

BACKGROUND OF THE INVENTION

1. Field of the Invention

The invention relates to integrated circuit type semiconductor memories organized in rows and columns and, more particularly, in such memories, it relates to a circuit to keep the column voltage constant during the recording.

2. Discussion of the Related Art

A standard type of semiconductor memory comprises, for example, about 16 million memory cells (16 megabits) that are organized in 32 sectors of 512,000 bits, each sector containing 64,000 words of eight bits each.

Broadly speaking, and as an indication, it may be said that an integrated, non-volatile, electrically erasable programmable memory 10 (FIG. 1) comprises memory cells, each including an N type floating-gate MOSFET transistor, $C1_1$ to $CN$ for the first column BL1 (also called a bit line) and $C1n$ to $CNn$ for the last column BLn. The selection of a memory cell that is located at the intersection of a column and a row is done by a column-addressing circuit 11 and a row-addressing circuit 12. For each column, the indication of the binary value of the information element to be recorded in a memory cell is obtained by a programming circuit 13. The columns are connected to a voltage generator 14 that gives a voltage U.

The row-addressing circuit 12 receives the address code of a row and gives one of the row selection signals R1 to RN which is applied to the gate G of the transistors of the same row.

The column-addressing circuit 11 has two decoding circuits $11_1$ and $11_2$, each receiving a part of the address code of a column and each giving a signal for the selection of a column that is applied to the gate G of one of the transistors $T2_1$ to $T2_n$ or $T3_1$ to $T3_n$ which are N-type MOSFET transistors.

The circuit 13 for programming the binary value to be recorded in the memory cell comprises one P type MOSFET transistor ($Tl_1$ to $Tl_n$) per column which receives the binary value 0 or 1 at its gate, by means of a matching circuit $13_1$ to $13_1$.

In a column such as BL1, the transistors $Tl_1$, $T2_1$, $T3_1$ are series-connected while the transistors $Cl_1$ to $CN_1$ are each in parallel between a column and a row, the drain being connected to the column and the sources of all the transistors being connected to a supply circuit (not shown).

In the memory that has just been described briefly with reference to FIG. 1, the recording of the information elements in the memory cells is preceded by an operation to erase all the cells so as to place them in a determined state, for example the state 1 which corresponds to the absence of electrons in the floating gate of the transistor of the memory cell. For the recording of a word, only the cells that have to record a 0 state will be selected for the simultaneous application, to these cells, of an appropriate voltage to the drain (for example 5–7 volts) and to the gate (for example 12 volts) while the source remains at zero volts. The voltage U is diverted towards the bit lines by the column addressing circuit 11 and the programming circuit 13.

The different operations that are carried out in the memory are under the control of the signals given by a memory control circuit 9 which is of any known type.

In such an assembly, the drops in voltage, which are due to the parasitic resistance and transfer resistance of the transistors of the programming circuit 13 and addressing circuit 11, lower the voltage applied to the column BL which depends on the current in the column.

SUMMARY OF THE INVENTION

An object of the present invention is to make an integrated circuit memory comprising a circuit that can be used to obtain a voltage at the column BL selected for the recording of a binary value that is independent of the voltage drops at the terminals of the programming and selection transistors.

According to the invention, there is proposed a non-volatile, electrically erasable programmable integrated circuit memory, said memory being organized in rows and columns of memory cells, said rows being selected by row-addressing circuits, said columns or bit lines being selected by column-addressing circuits comprising at least one series-connected selection transistor on the bit line, each bit line comprising a circuit for the programming of the binary value to be recorded, wherein said memory comprises a voltage-holding circuit the output terminal of which is connected to the bit line decoding circuit to keep the voltage of the bit line at a constant value when this bit line is selected to record a binary value.

The voltage-holding circuit comprises a differential amplifier that measures the difference between a reference voltage and a voltage representing the bit line and that gives a signal leading to reduce the difference between the reference voltage and the representative voltage, said signal being applied to the gate of a column selection transistor on the bit line.

BRIEF DESCRIPTION OF THE DRAWINGS

Other features and advantages of the present invention shall appear from the following description of a particular embodiment, said description being made with reference to the appended drawing wherein.

In the different figures, the same references designate the same elements in identical functions.

DETAILED DESCRIPTION

Figure 1:
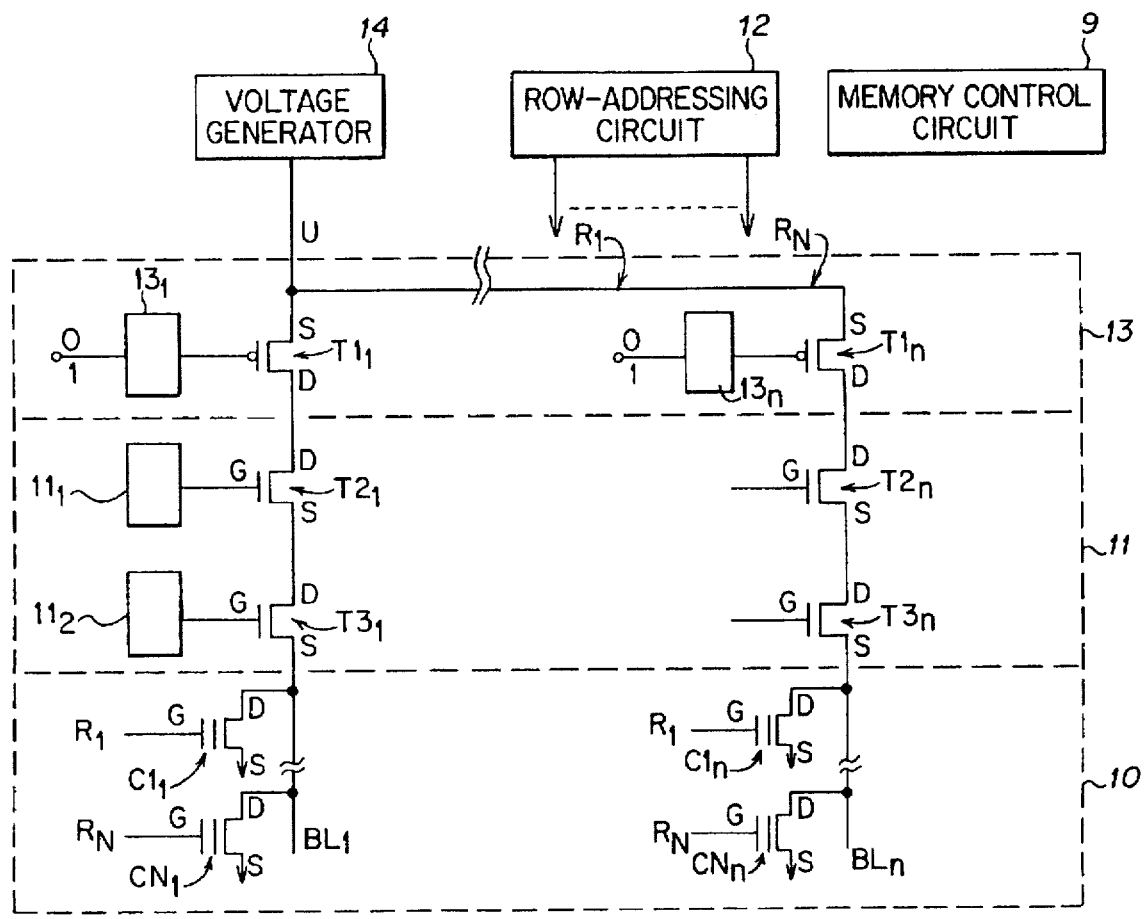
FIG. 1 is a block diagram of a non-volatile, electrically erasable programmable, semiconductor integrated circuit memory according to the prior art.

FIG. 1, which corresponds to the prior art described in the introduction, shall not be described again but forms an integral part of the description of the invention.

Figure 2:
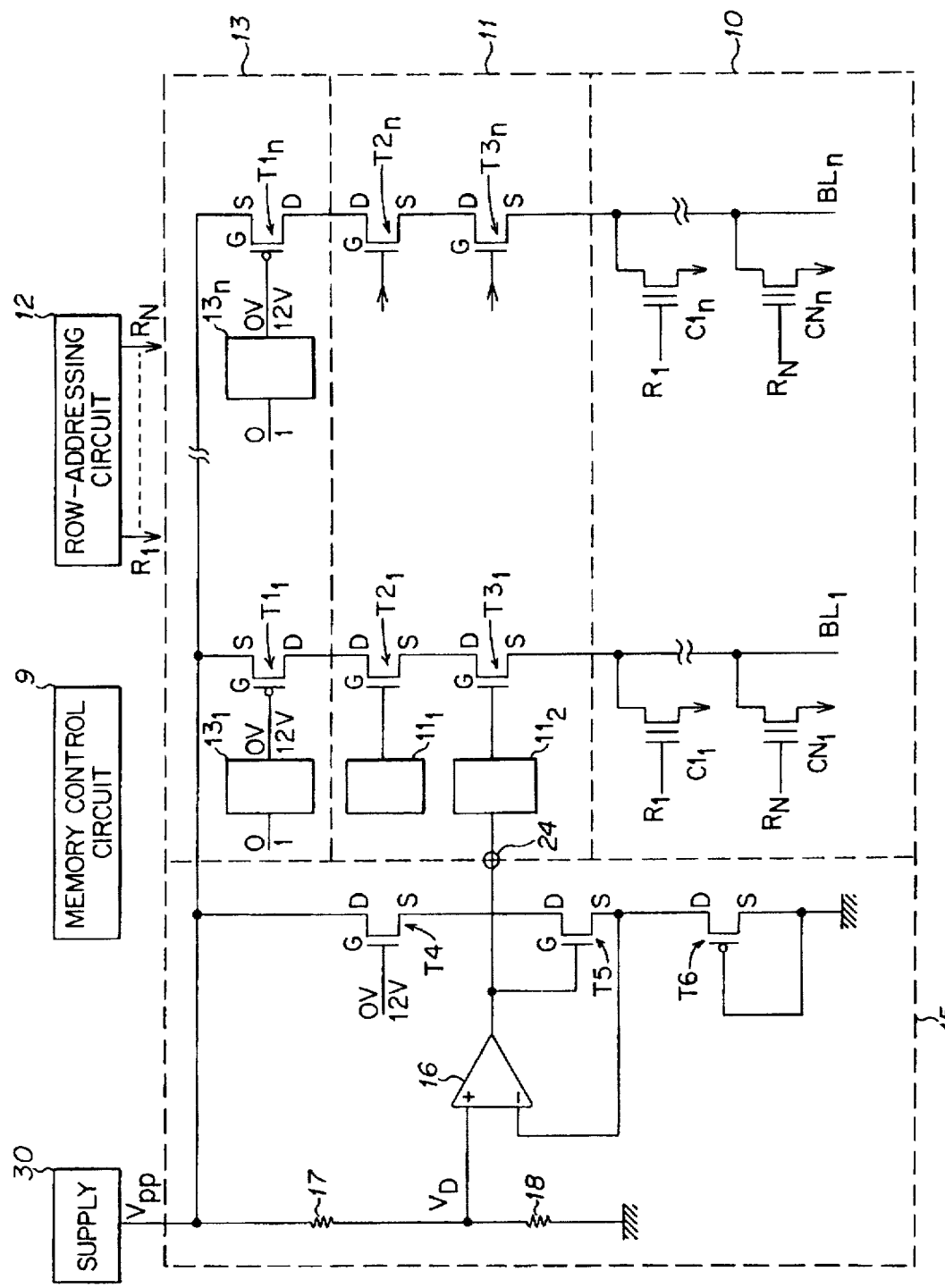
FIG. 2 is a block diagram of an integrated circuit memory comprising a holding circuit according to the invention.

The diagram of FIG. 2 is identical to that of FIG. 1 except as regards an element 15 which constitutes the circuit according to the invention.

This circuit has three transistors T4, T5 and T6 which are series-connected between a potential Vpp=12 volts, given by the supply device 30, and the ground. The first N-type transistor T4 has its drain connected to the potential Vpp and its source connected to the drain of the second N-type transistor T5. The gate of the transistor T4 is connected to a voltage generator which gives a voltage U=12 volts or a voltage of zero volt, the choice being made by the programming, depending on whether or not the memory is in a recording cycle or a reading cycle. The source of the N-type second transistor T5 is connected to the drain of the third transistor T6, which is a P-type transistor, the source of which is connected firstly to the ground and, secondly, to the gate.

Figure 3:
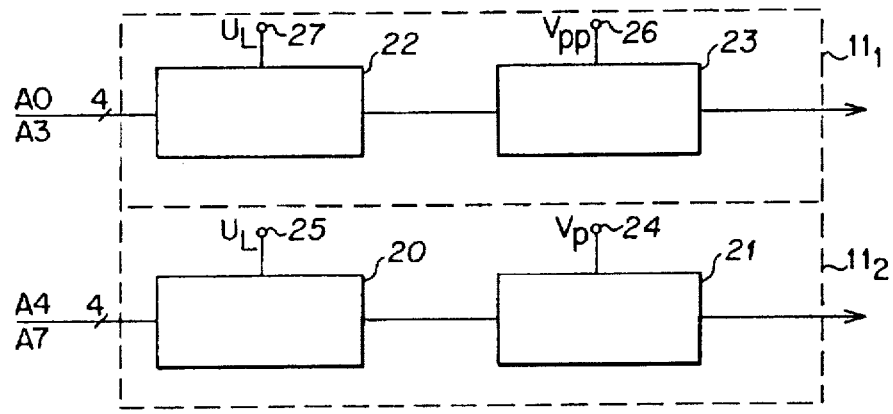
FIG. 3 is a block diagram of the circuits for the addressing of the columns of the integrated circuit memory.

The source of the transistor T5 is connected to a subtractive input terminal of a differential amplifier 16 the other input terminal of which is connected to the common point of two resistors 17 and 18 that are series-connected between the potential Vpp and the ground. The output terminal of the differential amplifier 16 is connected firstly to the gate of the second transistor T5 and to an input of the addressing circuit 11$_2$, the associated transistor T3$_1$ of which is directly connected to the column or bit line BL. As can be seen in the block diagram of FIG. 3, the addressing circuit 11$_2$ comprises, in a known way, a circuit 20 for the decoding of the digits A4 to A7 of the addresses of the columns which are applied to its input terminals.

The output terminal of the decoding circuit 20 is either at the "zero volt" level or at the logic level UL applied to an input terminal 25, equal for example to five volts. This output signal is applied to a voltage pull-up circuit 21 which gives, at its output, either the "zero volt" level or a level Vp which is given by an input terminal 24 supplied at the voltage Vp. The addressing circuit 11$_1$ is similar to the addressing circuit 11$_2$ except that it receives the digits A0 to A3 of the column addresses at the input terminals of a decoding circuit 22 supplied by a voltage UL at an input terminal 27 and that the output level Vpp of 12 volts is given by an input terminal 26 supplied with the voltage Vpp. According to the invention, the output terminal of the differential amplifier is connected to the input terminal 24 of the voltage pull-up circuit 21.

The transistor T5 is identical to the transistor T3$_1$ of the addressing circuit 11. The transistor T6 is chosen so as to have a conduction resistance equal to that of the bit line in the case of a memory transistor in a programming state.

The transistor T4 is conductive during the recording cycle by its gate voltage at U=12 volts and is non-conductive outside this cycle so as to disconnect the circuit according to the invention when there is no recording cycle.

The values of the resistors 17 and 18 are chosen so that the reference input voltage of the differential amplifier 16 is a voltage VD that is desired at the drain of the transistor T3$_1$. Thus, the differential amplifier 16 compares the voltage VD with the voltage VS of the source of the transistor T5 and modifies its output voltage so that the source of T5 is at the voltage Vp. The result thereof is that the supply voltage Vp at the terminal 24 remains constant and that the voltage on the bit line BL is independent of the current in the transistors T$_1$, T$_2$.

The different operations to be carried out in the memory are controlled by the control circuit 9.

The reference voltage is equal to the drain voltage (VD) to be obtained on the drain of the selection transistor T3 and is given by a resistive voltage divider.

The voltage representing the bit line is given by a resistance connected to a current generator including an image transistor T6, said resistance being equal to that of the bit line when a cell is conductive and the current of the generator being equal to that flowing in the bit line when a cell is conductive.

The voltage representing the bit line is given by an image transistor T6 the conduction resistance of which is equal to that of the bit line when a cell is conductive.

The image transistor T6 is series-connected with a follower transistor T5, that is identical to the column selection transistor T3$_1$. The follower transistor T5 and the column selection transistor T3$_1$ are mounted in a follower assembly so that the gates of the two transistors are connected to the output terminal of the differential amplifier. The drain of the follower transistor T5 is connected to the supply voltage Vpp by means of a switch-over transistor T4 that is conductive only during the recording cycle of the memory 10, so that the holding circuit 15 is active only during said recording cycle.

The invention has been described with reference to column-addressing circuits at two levels, but it can be applied to the case where there is only one addressing level that would have the transistor T3$_1$ in each column.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A voltage-holding circuit connected to a gate of a transistor for controlling a source voltage of said transistor, said transistor having a drain connected to a transistor voltage source and a source connected to an application circuit, said voltage-holding circuit comprising:

a voltage source providing a signal representing said source voltage;

representing means for representing the voltage and current characteristics of said application circuit; and a comparison means, having inputs connected to said voltage source and said representing means and having an output connected to said representing means and said gate, for outputting a signal reducing a difference between a voltage of said voltage source and a voltage of said representing means.

2. A voltage-holding circuit according to claim 1, wherein said voltage source includes a resistive voltage divider connected to said transistor voltage source.

3. A voltage-holding circuit according to claim 1, wherein said comparison means includes a differential amplifier.

4. A voltage-holding circuit according to claim 1, wherein said representing means includes a follower transistor having a drain connected to said transistor voltage source, a source connected to an input of said comparison means and a gate connected to said output of said comparison means.

5. A voltage-holding circuit according to claim 4, wherein said representing means further includes an image transistor having a drain connected to said source of said follower transistor and a source connected to a gate and connected to ground.

6. A method of providing a predetermined source voltage at the source of a transistor having a drain connected to a voltage source and a source connected to a bit line, said method comprising the steps of:

applying a voltage signal to a gate of said transistor;

applying said voltage signal to a representation circuit representative of voltage and current characteristics of said transistor and bit line;

comparing a circuit voltage of said representation circuit and a predetermined voltage; and adjusting said voltage signal to reduce a difference between said circuit voltage and said predetermined voltage.

7. The method of claim 6, wherein said second applying step includes applying said voltage signal to a gate of a follower transistor in said representation circuit, and wherein said comparing step includes comparing a source voltage of said follower transistor with said predetermined voltage.

8. The method of claim 7, wherein said second applying step further includes connecting the source of the follower transistor to a image transistor which represents the voltage and current characteristics of the bit line.

9. The method of claim 6, wherein said comparing step includes applying said predetermined voltage and said circuit voltage to a differential amplifier, and wherein said adjusting step includes applying the output of said differential amplifier to said representation circuit and said gate of said transistor.

10. The method of claim 6, wherein said first applying step includes selectively applying said voltage signal to said gate when a memory cell connected to said bit line is to be recorded.

* * * * *